United States Patent
Khan et al.

(10) Patent No.: US 12,157,847 B1
(45) Date of Patent: Dec. 3, 2024

(54) METHODS OF FORMING AN ADHESIVE LAYER, AND RELATED ADHESIVE FILMS AND METHODS AND SYSTEMS OF USING ADHESIVE FILMS

(71) Applicant: Seagate Technology LLC, Cupertino, CA (US)

(72) Inventors: Zubair Ahmed Khan, Villa Park, IL (US); Sarah R. Marotz, Bloomington, MN (US); Willis J. Johnson, Eagan, MN (US); Andrew D. Habermas, Bloomington, MN (US)

(73) Assignee: Seagate Technology LLC, Fremont, CA (US)

( * ) Notice: Subject to any disclaimer, the term of this patent is extended or adjusted under 35 U.S.C. 154(b) by 218 days.

(21) Appl. No.: 16/715,913

(22) Filed: Dec. 16, 2019

Related U.S. Application Data

(60) Provisional application No. 62/780,971, filed on Dec. 18, 2018.

(51) Int. Cl.
| | |
|---|---|
| *C09J 133/12* | (2006.01) |
| *B24B 37/11* | (2012.01) |
| *C09J 7/38* | (2018.01) |
| *C09J 7/40* | (2018.01) |
| *C09J 133/08* | (2006.01) |
| *H01L 21/02* | (2006.01) |
| *H01L 21/673* | (2006.01) |
| *B05D 5/10* | (2006.01) |

(52) U.S. Cl.
CPC .............. *C09J 7/385* (2018.01); *B24B 37/11* (2013.01); *C09J 7/401* (2018.01); *C09J 7/405* (2018.01); *C09J 133/08* (2013.01); *C09J 133/12* (2013.01); *H01L 21/02013* (2013.01); *H01L 21/673* (2013.01); *B05D 5/10* (2013.01); *C09J 2203/326* (2013.01); *C09J 2301/1242* (2020.08); *C09J 2301/408* (2020.08); *Y10T 428/1476* (2015.01); *Y10T 428/2848* (2015.01); *Y10T 428/2891* (2015.01)

(58) Field of Classification Search
None
See application file for complete search history.

(56) References Cited

U.S. PATENT DOCUMENTS

| | | | |
|---|---|---|---|
| 4,274,991 A * | 6/1981 | Hinz | ..................... C07C 309/65 |
| | | | 524/158 |
| 5,117,589 A | 6/1992 | Bischoff et al. | |
| 5,591,820 A | 1/1997 | Kydonieus et al. | |
| 6,093,083 A | 7/2000 | Lackey | |
| 6,344,949 B1 | 2/2002 | Albrecht et al. | |
| 6,374,479 B1 | 4/2002 | Sasaki et al. | |
| 6,471,882 B1 | 10/2002 | Namikawa et al. | |
| 6,475,064 B2 | 11/2002 | Hao et al. | |
| 6,662,069 B1 | 12/2003 | Khlif | |
| 6,663,817 B1 | 12/2003 | Chang et al. | |
| 7,196,872 B2 | 3/2007 | Chaw et al. | |
| 7,504,038 B2 | 3/2009 | Bietsch et al. | |
| 8,066,547 B1 | 11/2011 | Schuh et al. | |
| 8,883,281 B2 | 11/2014 | Liu et al. | |
| 9,017,139 B2 | 4/2015 | Ronshaugen et al. | |
| 9,352,442 B2 | 5/2016 | Tan et al. | |
| 10,183,376 B1 | 1/2019 | Xiong et al. | |
| 10,465,099 B1 | 11/2019 | Khan et al. | |
| 2004/0259474 A1 | 12/2004 | Oyama et al. | |
| 2007/0172649 A1 * | 7/2007 | Aihara | ..................... C09J 7/381 |
| | | | 428/343 |
| 2010/0124627 A1 | 5/2010 | Nonaka et al. | |
| 2010/0162556 A1 | 7/2010 | Guruz et al. | |
| 2012/0009399 A1 | 1/2012 | Nonaka et al. | |
| 2014/0273764 A1 | 9/2014 | Ronshaugen et al. | |
| 2016/0215178 A1 * | 7/2016 | Inenaga | .................. G02B 1/111 |
| 2018/0291238 A1 * | 10/2018 | Erdogan-Haug | ......... B32B 3/04 |
| 2019/0010361 A1 * | 1/2019 | Hoshi | .................. C09J 163/00 |
| 2019/0062608 A1 * | 2/2019 | Aloshyna ep Lesuffleur ............. |
| | | | B32B 37/10 |
| 2020/0090687 A1 | 3/2020 | Khan et al. | |

FOREIGN PATENT DOCUMENTS

| | | | | |
|---|---|---|---|---|
| WO | WO-9608367 A2 * | 3/1996 | ........... B05C 5/0254 |

OTHER PUBLICATIONS

"Alkylsulfonic acid ester of phenol", LANXESS Energizing Chemistry, Product Safety Assessment, Last Revised Aug. 2018, (3 pages).
Satas, "Handbook of Pressure Sensitive Adhesive Technology", 2nd edition, p. 172, 1989, (1 pages).
Khan et al., Unpublished United States Utility U.S. Appl. No. 18/224,910, filed Jul. 21, 2023 (Not attached).

\* cited by examiner

*Primary Examiner* — Anish P Desai
(74) *Attorney, Agent, or Firm* — Kagan Binder, PLLC

(57) ABSTRACT

The present disclosure relates to methods of forming adhesive films having at least one pressure-sensitive adhesive polymer, related films, and related methods of using such films in lapping processes.

17 Claims, 1 Drawing Sheet

METHODS OF FORMING AN ADHESIVE LAYER, AND RELATED ADHESIVE FILMS AND METHODS AND SYSTEMS OF USING ADHESIVE FILMS

RELATED APPLICATION

The present Application is a Non-Provisional of U.S. Provisional Application Ser. No. 62/780,971 filed on Dec. 18, 2018, and entitled "METHODS OF FORMING AN ADHESIVE LAYER, AND RELATED ADHESIVE FILMS AND METHODS AND SYSTEMS OF USING ADHESIVE FILMS," which application is incorporated herein by reference in its entirety.

BACKGROUND

The present disclosure relates to adhesive compositions that can be used to mount a microelectronic device substrate such as a row bar to a carrier for one or more lapping steps.

SUMMARY

Embodiments of the present disclosure include methods of forming an adhesive film by
a) providing an adhesive composition that includes at least one pressure-sensitive adhesive polymer; and
b) forming a layer of the adhesive composition on a substrate to form the adhesive film. The adhesive composition layer has an elastic modulus in a range from 100 to 500 kilopascals, and a Tan Delta in a range from 0.05 to 0.2.

Embodiments of the present disclosure also include an adhesive film that includes at least one pressure-sensitive adhesive layer having at least one pressure-sensitive adhesive block copolymer. The at least one pressure-sensitive adhesive block copolymer includes at least one polyacrylate. The at least one pressure-sensitive adhesive layer has an elastic modulus in a range from 100 to 500 kilopascals, and a Tan Delta in a range from 0.05 to 0.2.

Embodiments of the present disclosure also include an adhesive film that includes at least one pressure-sensitive adhesive layer having at least one pressure-sensitive adhesive polymer, and at least one ester plasticizer. The at least one ester plasticizer is present in an amount of greater that 20 percent by weight of the total at least one pressure-sensitive adhesive layer. The adhesive layer has an elastic modulus in a range from 100 to 500 kilopascals, and a Tan Delta in a range from 0.05 to 0.2.

Adhesive films according to the present disclosure can be particularly advantageous in the context of kiss or fine lapping because the adhesive can provide desirable flexibility when removing relatively much lower amounts of material from a microelectronic substrate as compared to rough lapping.

Figure 1:
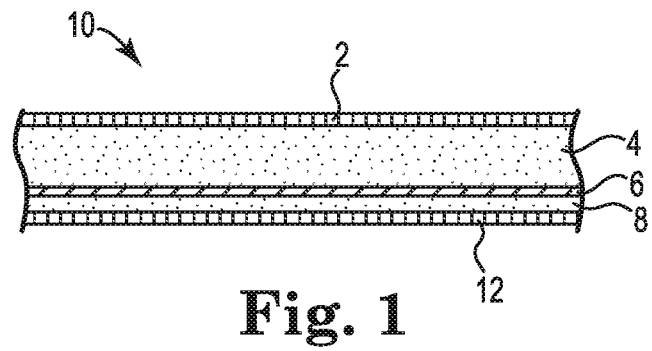
FIG. 1 is a schematic cross-sectional view of an adhesive film according to the present disclosure.

The drawings are schematic and not to scale.

DETAILED DESCRIPTION

Embodiments of the present disclosure methods of forming an adhesive film and pressure sensitive adhesive compositions for securing one or more microelectronic device substrates (e.g., one or more row bars or sliders) to a carrier during lapping.

Methods of forming an adhesive film according to the present disclosure include providing an adhesive composition that can be coated onto a substrate to form an adhesive film layer. An adhesive film layer according to the present disclosure includes at least one pressure-sensitive adhesive polymer. As used herein, a pressure-sensitive adhesive "polymer" that is present in an adhesive film composition that is to be coated onto a substrate means that the polymer has already been polymerized prior to coating and is substantially chemically inert prior to coating. As used herein, "chemically inert" with respect to a polymer means that the polymer has been fully polymerized and does not undergo any further chemical reaction during and/or after coating to an undue degree. Examples of such chemical reaction include polymerization and/or cross-linking. By avoiding any chemical reaction to an undue degree during coating, the adhesive film layer can be coated so that one or more of its properties are relatively more uniform within a given film and from batch to batch during manufacturing as compared to one or more adhesives that may react during the coating process. This can be very advantageous in lapping microelectronic device substrates. For example, when lapping a row bar having a plurality of sliders, having an adhesive film layer with highly uniform properties (e.g., elastic modulus) throughout the layer can translate into improved predictability of lapping to target specifications among one or more sliders within a row bar and/or from row bar to row bar. As another example, adhesive chemistries that may not properly react during adhesive film formation may subsequently leach out, e.g., during row bar lapping and/or row bar cleaning and contribute to undue contamination.

In addition to selecting one or more pressure-sensitive adhesive polymers that provide desirable coating properties, the present disclosure also involves selecting one or more pressure-sensitive adhesive polymers, and optionally one or more additives, for an adhesive composition layer that help provide one or more desirable properties related to lapping a microelectronic device substrate that is mounted to and secured by the corresponding adhesive composition layer. In some embodiments, an adhesive film layer according to the present disclosure can securely adhere a microelectronic device substrate during lapping, yet provide desired flexibility during lapping (e.g., to allow movement due to individual actuators on a carrier) and desired dismounting properties so that the microelectronic device substrate can be removed after lapping (e.g., via solvent and/or mechanically (e.g., with a tweezers)) without leaving an undue amount (e.g., none) of adhesive residue on the microelectronic device substrate. In some embodiments, an adhesive composition according to the present disclosure can also provide desired chemical resistance to lapping lubricants (e.g., mineral oil) that may be used. Resistance to mineral oil means that the adhesive composition does not degrade in the presence of mineral oil to an undue degree, and is dimensionally stable in the presence of mineral oil, at least to degrees that are sufficient for the adhesive to be useful in a lapping step as described.

An adhesive composition according to the present disclosure can be formulated to provide one or more quantitative properties discussed herein below so as to help provide one or more desirable qualitative properties as described herein.

For example, in lapping processes (e.g., kiss lapping) a carrier can be used to hold a microelectronic device substrate via one or more adhesive layers, and place the substrate in contact with a moving (e.g. rotating) abrasive material, at a desired pressure, for an amount of time that is effective to remove a desired amount of material from the surface of the substrate that is held in contact with the moving abrasive (sometimes referred to herein as the "contacted surface"). During lapping, as the substrate is held in contact with the moving abrasive material, and surface layer material is removed from the contacted surface, frictional forces are placed on the surface of the substrate that contacts the abrasive. The forces will remove material from the contacted surface and will also produce a force at the contacted surface in a direction of movement of the abrasive material relative to the contacted surface, i.e., along the contacted surface in a direction from a first end ("leading end") to a second end ("trailing end") of the surface. This force can cause an amount of torque to be produced on the substrate, causing the first (leading) end to be drawn toward the abrasive material. That torque can, in turn, become applied to the pressure-sensitive adhesive layer that holds the opposite ("non-contacted") surface of the substrate to the carrier. Depending on the mechanical properties of the adhesive composition layer, e.g., elasticity and flow properties as measured by Elastic Modulus and Tan Delta, the adhesive composition layer may be capable of allowing or preventing useful lapping of the substrate in the presence of the applied torque. More specifically with respect to lapping a slider assembly or slider row bar, mechanical properties of the pressure-sensitive adhesive layer will affect the amount of material that is removed from a surface of a slider element portion of a slider assembly substrate, especially at and toward the first end of the substrate, thus affecting the global shaping of the slider element.

An adhesive composition layer according to the present disclosure that is used to mount a microelectronic device substrate to a carrier can provide desirable flow and elasticity properties that result in a desired level of flexibility, resulting in a very slight amount of controlled movement of the microelectronic device substrate, especially twisting, relative to the carrier and the moving abrasive. Such slight controlled movement can result in a useful, desired, or advantageous degree and form of global shaping of a slider element surface of a slider assembly during lapping such as kiss lapping.

Accordingly, mechanical properties, as well as adhesive properties of an adhesive used in a lapping step can be of high importance, with certain properties identified as particularly desired for the adhesive to perform well as a lapping adhesive. Nonlimiting examples of these properties include "Elastic Modulus" and "Tan Delta," which is related to Elastic Modulus. Another useful parameter that can be considered is the adhesive peel strength (peel force, e.g., measured in a shear direction and reported as "Peel Force") of the adhesive composition.

Elastic Modulus (G' or "Storage Modulus") relates to the flexibility of an adhesive composition. Flexibility of the adhesive composition allows for movement (deformation) of the adhesive while the adhesive composition holds the substrate onto a surface of a carrier while the substrate contacts a moving abrasive material during lapping. An example of such movement could be due to movement of an individual actuator of a carrier during actuated lapping, which is discussed further below. Depending on its Elastic Modulus, the adhesive composition will allow for a greater or a lesser amount of movement, e.g., twisting (about an axis extending along a length (the longest dimension) of a slider row bar substrate) of the substrate in response to the torque applied to the substrate by the abrasive material moving against the contacted surface. A greater or lesser Elastic Modulus of the adhesive can allow for more or less twisting of the substrate, resulting in either a greater or a lesser amount of material being removed from the substrate, especially at a forward end of the substrate, and a greater or a lesser degree of global shaping of the substrate being produced during lapping (e.g., kiss lapping).

Loss Modulus (G") is another desirable mechanical property of an adhesive composition to consider, and relates to flow properties of the adhesive. Like the Elastic Modulus, the Loss Modulus of an adhesive composition can also affect the global shaping of the substrate during lapping by allowing for more or less twisting of the substrate and a greater or a lesser amount of material being removed from a leading end of the substrate.

Along with the Elastic Modulus (G'), the Loss Modulus (G") of the adhesive can also affect the removal of material from a substrate surface during lapping, and influence the global shaping of the substrate by allowing for a greater or a lesser amount of material to be removed from the leading end of the substrate due to controlled twisting of the substrate relative to the carrier and the moving abrasive due to torque resulting from applied frictional forces. The Elastic Modulus (G') and the Loss Modulus (G") can be considered together as a single unit-less value known as "Tan Delta," which is the ratio of Loss Modulus divided by Elastic Modulus, G"/G'.

Elastic Modulus, Loss Modulus, and Tan Delta can vary with temperature. An adhesive layer according to the present disclosure can be used in a range of environments and temperatures. In some embodiments, a microelectronic substrate can be mounted to a carrier and lapping performed on the microelectronic substrate at ambient temperatures (e.g., from 20-35° C.). Despite being exposed to one or more operating temperatures, the Elastic Modulus, Loss Modulus, and/or Tan Delta of a desirable adhesive layer according to the present disclosure can be reported at single temperature such as 20° C., 25° C., and the like.

Elastic Modulus and Loss Modulus can each be measured by known techniques and using equipment that is known and commercially available. One well-understood method for measuring Elastic Modulus and Loss Modulus and related mechanical properties (e.g., Tan Delta) of adhesive compositions is dynamic mechanical analysis (DMA), by use of a parallel plate rheometer (or oscillatory rheometer) programmed to characterize the physical properties of a sample of an adhesive composition. Various commercial rheometers are available from companies that include TA Instruments (New Castle, Delaware, USA) and Anton Paar GmbH, Austria. According to the present disclosure, Elastic Modulus, Loss Modulus, and Tan Delta of an adhesive composition as described herein can be measured by use of a commercially available rheometer (such as a Modular Compact Rheometer MCR 302 from Anton Paar) using settings that include a temperature of 25 degrees Celsius, a frequency of 10 hertz, an amplitude of 10 millirad, and a strain of 0.2 percent. For a "frequency sweep" test method wherein the angle of oscillatory movement and the temperature are held constant, the frequency can be varied from 100 hertz to 0.1 hertz.

In some embodiments, adhesive composition layer can have an Elastic Modulus in a range from 100 to 500 kilopascals, from 150 to 450 kilopascals, or even from 200 to 400 kilopascals.

In some embodiments, an adhesive composition layer can have a Tan Delta that does not exceed about 0.2, e.g., a Tan Delta in a range from 0.05 to 0.2, from 0.05 to 0.15, or even from 0.08 to 0.1.

Since Tan Delta is the ratio of Loss Modulus/Elastic Modulus, the Loss Modulus of an adhesive composition layer can vary such that when it is divided by Elastic Modulus it has a desirable Tan Delta value as described above.

The Loss Modulus, and hence the Tan Delta, can vary, e.g., in some embodiments as the weight ratio of polymer to plasticizer changes. In some embodiments, as the amount of plasticizer is increase relative to the amount of polymer, the Loss Modulus increases, thereby causing the Tan Delta to increase.

Another property of an adhesive composition layer that can be important in a lapping process is Peel Force (peel adhesion or peel strength) of the adhesive, which is a measure of the bond strength created, e.g., in a shear direction, between a surface of a microelectronic device substrate and a surface of the adhesive composition layer that contacts the surface of the substrate. A desired Peel Force value of an adhesive composition layer according to the present disclosure can provide sufficient tack so that a microelectronic device can securely adhere to the adhesive composition layer, and consequently either directly or indirectly to a surface of a carrier, during lapping, while at the same time permitting the microelectronic device to be removed (separated) from the adhesive layer after lapping (e.g., via solvent and/or mechanically (e.g., with a tweezers)) without damaging the microelectronic device substrate and/or without leaving an undue amount (e.g., none) of adhesive residue on the microelectronic device substrate. If the Peel Force is too low, a microelectronic device substrate such as a slider rowbar may not adhere to the adhesive composition layer and to the carrier during the lapping step. If the Peel Force is too high, the microelectronic device substrate (e.g., slider rowbar) may be too difficult to remove from the adhesive composition layer and the carrier following lapping, and the substrate may be damaged during its removal from the carrier and/or have an undue amount of adhesive residue remaining thereon.

Peel Force can be measured by known techniques and using equipment that is known and commercially available. One well-understood method for measuring Peel Force is by use of a shear tester apparatus, such as one sold under the trade name Dage, e.g., of the Dage 5000 series. According to the present description, Peel Force of an adhesive composition layer as described can be measured by this instrument or a similar instrument using a 5000 kilogram (kg) (or 1000 kg) load cell, a 100 gram test load, a test speed of 25 microns per second, a shear height of 20 microns, and a BST-1.00 Dage DWG test needle.

In some embodiments, in addition to an Elastic Modulus and a Tan Delta as specified herein, an adhesive composition layer can have a Peel Force in a range from 50 to 1000 grams force, from 50 to 500 grams force, or even from 100 to 250 grams force.

According to the present disclosure, an adhesive composition can be referred to as a pressure-sensitive adhesive composition. A "pressure-sensitive adhesive" (PSA) composition is used as that term is generally used and understood in the chemical and adhesive arts, to describe materials that are inherently tacky or, by the addition of tackifying resins ("tackifiers") are formulated to be tacky, meaning sticky to the touch at a surface. Examples of materials that are classified as pressure-sensitive adhesives are described in D. Satas, *Handbook of Pressure-sensitive adhesives*, $2^{nd}$ edition, page 172, 1989.

An adhesive composition according to the present disclosure includes at least one pressure-sensitive adhesive polymer. In some embodiments, the at least one pressure-sensitive adhesive polymer includes at least one polyacrylate.

In some embodiments, the at least one pressure-sensitive adhesive polymer includes at least one block copolymer that includes at least one polyacrylate. A block copolymer includes two or more homopolymer subunits linked by covalent bonds. The connection of the homopolymer subunits may include an intermediate non-repeating unit, sometimes referred to as a junction block. In some embodiments, the at least one polyacrylate is chosen from polymethylmethacrylate, polybutylacrylate, polyhydroxyethylmethacrylate, poly 1,3-butanediol, dimethacrylate, polyethylacrylate, and combinations thereof.

The at least one pressure-sensitive adhesive polymer can be present in the adhesive composition (and corresponding layer) in an amount that provides one or more desired properties as described herein. In some embodiments, an adhesive composition can include at least one pressure-sensitive adhesive polymer as described herein in an amount from 50 to 99 percent by total weight of the of the adhesive composition, from 60 to 95 percent by total weight of the of the adhesive composition, or even from 70 to 90 percent by total weight of the of the adhesive composition.

Optionally, an adhesive composition (and corresponding layer) according to the present disclosure can include one or more additives in an amount to promote desired flexibility of the adhesive composition as described herein, especially during lapping operations such as actuated lapping. In some embodiments, an amount of one or more plasticizers are included as additives in an adhesive composition. The amount of the one or more plasticizers can be selected to provide desirable flexibility of the adhesive composition while still providing desirable Peel Force of the adhesive composition. As discussed above, permitting slight controlled movement of a microelectronic substrate due to a sufficiently flexible adhesive layer can result in a useful, desired, or advantageous degree and form of global shaping of the microelectronic substrate. In some embodiments, as the amount of plasticizer is increased, the adhesion (as measured in terms of Peel Force) deceases. In such embodiments, it can be desirable to not include too much plasticizer so that the microelectronic device substrate does not separate (e.g., completely detach) from the adhesive layer during lapping. In some embodiments, one or more properties of an adhesive composition can be relatively more stable as ambient temperature increase if less plasticizer is used.

In some embodiments, a plasticizer can be selected to have desirable saponification resistance and/or flash point so that the plasticizer and Tan Delta of the adhesive composition layer are stable overtime. Saponification resistance is a measure of resistance to hydrolysis and esterification. Flash point of a plasticizer is a measure of the lowest temperature at which a plasticizer in liquid form can form an ignitable mixture in air near the surface of the liquid plasticizer. In the context of the present disclosure, an ester plasticizer can be selected to have a high enough flash point so that the plasticizer tends to remain in the polymer and not leave the matrix to cause the Tan Delta to vary to an undue degree over time. In some embodiments, a plasticizer can have a flash point of 190° C. or greater, 200° C. or greater, or even 220° C. or greater.

A plasticizer can be included in an adhesive composition in an amount to provide one or more adhesive properties as describe herein. In some embodiments, the plasticizer content can be in an amount of 40 percent or less based on the total weight of the adhesive composition. For example, the plasticizer content can be from 5 to 40 percent, from 5 to 35 percent, from 5 to 30 percent, from 5 to 20 percent, or event from 5 to 10 percent by total weight of the adhesive composition. In some embodiments, depending on the one or plasticizers selected, the plasticizer content can be greater than 20 percent but less than 35 percent by weight of the total adhesive composition so as to provide desired flexibility while at the same time providing enough adhesion and tack (e.g., as measured by Peel Force value).

A variety of plasticizers can be included in adhesive composition according to the present disclosure. In some embodiments, at least one ester plasticizer can be included in an adhesive composition according to the present disclosure. Non-limiting examples of ester plasticizers include ester of phenol plasticizers such as alkylsulfonic acid ester of phenol.

If desired, adhesive compositions according to the present disclosure can avoid an undue amount of silicone (e.g., include no silicone). Silicone can be undesirable if present as a contaminant of a microelectronic device, even if present at only a very tiny amount. For example, silicones, being useful as release agents, can cause great difficulties in trying to bond an applied layer of material to a surface that is contaminated with a silicone; as an example, if metallization is attempted on a surface that is contaminated with silicone, adhesion can be greatly diminished. Silicone contamination of magnetic and chemical sensors can be undesirable; even parts-per-million amounts of silicone present on a surface of a sensor can impede performance of the sensor to an undue degree. Minimal exposure of a hard disk read-write head to silicone can result in undue errors or drive failure.

In some embodiments, adhesive compositions according to the present disclosure can avoid an undue amount of one or more catalysts. For example, tin is a known catalyst and can be disfavored for industrial uses, such as for uses in microelectronics manufacturing. According to the present disclosure, adhesive compositions are identified for use in a lapping process as described that do not require, and can preferably exclude the use of tin as a catalyst or for any other purpose in the adhesive composition. Adhesive compositions as described herein can be "free of tin," which means that the adhesive composition can include a non-tin-containing catalyst (e.g., a bismuth-based catalyst) and does not contain a tin-containing catalyst, or, alternately stated, can include less than 100 parts per million (ppm), e.g., less than 50, 10, 1, or 0.1 ppm tin, based on total weight of the adhesive composition.

An adhesive composition as described herein can be formed into one or more adhesive layers to form an adhesive film, and handled during use in any convenient fashion. For example, for use in a lapping step as described below, the adhesive composition can be in the form of a thin, (but not necessarily) continuous layer of the adhesive composition that can be placed between a flat surface of a substrate such as a slider rowbar, and a flat surface of a carrier. To provide for convenience of use when handling and placing a layer of the adhesive between a surface of a substrate and a surface of a carrier, the adhesive can be placed in contact with a release liner (or "transfer liner" or simply "liner"), which can be a flat film of material that can be useful to receive a film of the adhesive layer, and from which the adhesive layer can be easily and readily removed. Also, optionally, for convenience, an adhesive as described can be present as one or more layers in an adhesive "stack" that includes the adhesive layer, a release liner placed against one surface of the adhesive layer, and one or more additional layers such as a base layer on the side of the adhesive opposite of the release liner, a second adhesive (e.g., on the base layer on a side opposite of the adhesive material), and a second release liner in contact with a surface of the second adhesive.

An adhesive composition according to the present disclosure can be formed into an adhesive film such as a stack using a wide variety of techniques.

First, an adhesive composition can be formed by combining (e.g., mixing) one or more pressure-sensitive adhesive polymers as described herein with one or more optional additives (e.g., one or more plasticizers).

After forming the adhesive composition (that is "chemically inert") it can be coated onto as one or more layers onto a substrate to form an adhesive film (e.g., stack). For example, an adhesive can be provided so that it hot enough to flow and be coated into a layer on a substrate. In some embodiments, an adhesive composition can be melted and extruded as a layer onto a substrate to form an adhesive film. The adhesive composition can be coated as a layer having any desired thickness. Nonlimiting examples of an adhesive layer thickness includes a thickness from 2 to 30 mils, or even from 10 to 25 mils.

After cooling, the adhesive film can be cut into one or more strips for subsequent use. A wide variety of adhesive film structures can be formed using an adhesive composition according to the present disclosure. For example, multi-layer adhesive films can be formed that include one or more release liners, other adhesive layers, base layers, and the like. In some embodiments, an adhesive film can include at least a first release liner layer; a first adhesive layer having a first major surface adjacent to a major surface of the first release liner layer; a base layer having a first major surface adjacent to a second major surface of the first adhesive layer; a second adhesive layer that includes at least one pressure-sensitive adhesive layer according to the present disclosure and has a first major surface that is adjacent to a second major surface of the base layer; and a second release liner having a first major surface adjacent to a second major surface of the second adhesive layer.

A nonlimiting example of an adhesive film made with an adhesive composition according to the present disclosure is described with respect to FIG. 1.

FIG. 1 shows an example of an adhesive "stack" film that includes an adhesive composition as described herein, and that can be conveniently used in a lapping step as described. Referring to FIG. 1, stack 10 includes release liner 2, adhesive layer 4, base layer 6, adhesive layer 8, and second release liner 12.

Adhesive composition layer 4 is an adhesive material according to the present disclosure as described herein above that is formed from "chemically inert" polymers such as at least one pressure-sensitive adhesive block copolymer including at least one polyacrylate.

Adhesive layer 8 can be any adhesive that is effective to securely hold to a surface of a carrier during a lapping step. Examples of useful adhesive layer 8 include polyacrylate pressure-sensitive adhesives, especially high strength, organic solvent-containing polyacrylate pressure-sensitive adhesives.

Each release liner 2 and release liner 12 may be a polymeric film that will be releasable from, i.e., have low adhesion to, pressure-sensitive adhesive 4 or pressure-sensitive adhesive 8, respectively. Examples of polymeric films include temperature stable plastic films such as: polyester films, e.g., poly(ethylene terephthalate) (PET) films, poly (ethylene naphthalate) (PEN) film, and poly(butylene terephthalate) (PBT) films; olefinic films prepared from one or more α-olefins as monomer components, such as polyethylene (PE) films, polypropylene (PPs) films, polymethylpentene (PMP) films, ethylene-propylene copolymer films, and ethylene-vinyl acetate copolymer (EVA) films; poly (vinyl chloride) (PVC) films; vinyl acetate resin films; polycarbonate (PC) films; among others.

Base layer 6 may be made of any one or more of these polymeric films, and includes a surface that is adapted (e.g., primed) to receive and strongly adhere to adhesive 4 and adhesive 8.

For use in a lapping step as described, as mentioned above, a non-limiting thickness for adhesive layer 4 can be in a range from about 2 to 30 mils, from 10 to 25 mils, or even from 15 to 20 mils. A nonlimiting thickness for each of release liners 2 and 12 can be from 1 to 3 mils. A nonlimiting thickness for base layer 6 is from 3 to 10 mils (e.g., about 5 mils). A nonlimiting thickness of adhesive layer 8 can be in the range from 3 to 10 mils (e.g., about 5 mils). In some embodiments, the thickness of stack 10 can be in the range from 25 to 35 mils.

Figure 3:
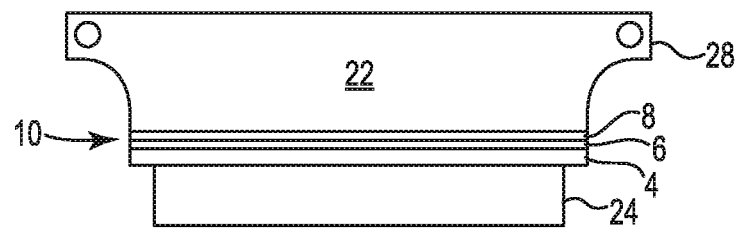
FIG. 3 is a schematic side view of a carrier tool ("carrier" or "lapping carrier") that includes a microelectronic device substrate secured to the carrier by an adhesive according to the present disclosure.

In use, the adhesives of stack 10 can be applied to a carrier by any order of steps that include removing the release liner 2, applying adhesive layer 4 to a surface of a substrate (opposite of a "contacted" surface of a lapping step), removing release liner 12, and applying adhesive layer 8 to a surface of a carrier, to produce a configuration as illustrated at FIG. 3, which shows adhesive layer 8 bonded on one of its surfaces to a surface of carrier 22 and being bonded on a second surface to base layer 6, and adhesive layer 4 being bonded on one surface to a surface of substrate 24 and being bonded on a second surface to base layer 6. Note that adhesive layer 4 need not be in direct contact with the surface of the carrier, but may optionally be adhered indirectly to, or non-directly placed or located on, the surface through one or more additional layers, such as another adhesive layer (e.g., adhesive 8), a base layer (6) of the described stack 10, or both.

In some embodiments, the structure including adhesive layer 4, base layer 6, and adhesive layer 8, with the release liners removed, can have a Tan Delta that satisfies the Tan Delta of the adhesive layer 4. For example, the structure including adhesive layer 4, base layer 6, and adhesive layer 8 has a Tan Delta that does not exceed about 0.2, e.g., a Tan Delta in a range from 0.05.

According to methods of the present disclosure, a pressure-sensitive adhesive as described can be used in a lapping step, e.g., a final lapping step or a "kiss lapping" step, for the purpose of securing a microelectronic device substrate (e.g., slider rowbar) to a carrier, to hold the substrate to a surface of the carrier during the lapping step. The lapping step can be designed to accomplish one or more important objectives. A first objective can be to remove an amount of material from a surface of the microelectronic device substrate to produce a desired thickness of a layer of the surface material, such as to produce a desired stripe height between a surface of a slider assembly and one or more transducer heads located below the surface of the slider assembly. A second possible objective is, by removal of the surface layer material, to produce a desired shape of a surface of the substrate, for example a desired shape of a surface of a slider element of a slider assembly.

A lapping process may be a multiple step process, beginning with an initial removal step, often called a "rough lapping" step, and ending with a polishing step, often called "kiss lapping" or "polishing lapping" step. The rough lapping step, or a combination of two or more rough lapping steps, may be performed to remove as much as from 1 to 20 microns, from 5 to 20 microns, or even from 10-15 microns of material from a substrate surface, such as from a surface of a slider bar. The kiss lapping step is a final polishing and a precision shaping step. Kiss lapping is less aggressive in its removal of material from the substrate as compared to a rough lapping step or steps. A kiss lapping step may typically result in removal of not more than 100 nanometers, 90 nanometers or less, or even 50 nanometers or less of material from the substrate surface, e.g., at a location of a stripe height measurement. A kiss lapping step can include a flexible mounting of the substrate to a carrier, to achieve desired global shaping of the slider element of a slider assembly during the lapping step. Accordingly, pressure-sensitive adhesives having mechanical properties as described herein can be useful in the kiss lapping step of a slider assembly, to result in desired global shaping of the slider element of the slider assembly, in addition to a desired amount of removal of surface layer material covering one or more transducer heads at an end of the slider assembly (measured as "stripe height"), that end being the "trailing end" of the slider assembly during the lapping step as the slider assembly contacts the abrasive material, with relative motion.

An example of a substrate 24 (see FIGS. 2 and 3) is a slider rowbar, which includes a contacted surface or surface layer made of a combination of aluminum oxide ($Al_2O_3$) and titanium carbide (TiC). At the start of a final lapping step, the thickness of the surface layer has previously been reduced by a rough lapping step. During the kiss lapping step, the amount of the material (e.g., aluminum oxide ($Al_2O_3$) and titanium carbide (TiC)) that is removed from the surface layer, e.g., at a location of a stripe height, will usually be an amount that is less than about 100 nanometers, for example from about 5 to about 80 nanometers of material, or from about 10 to about 30, 40, 50, or 60 nanometers of material.

Figure 2:
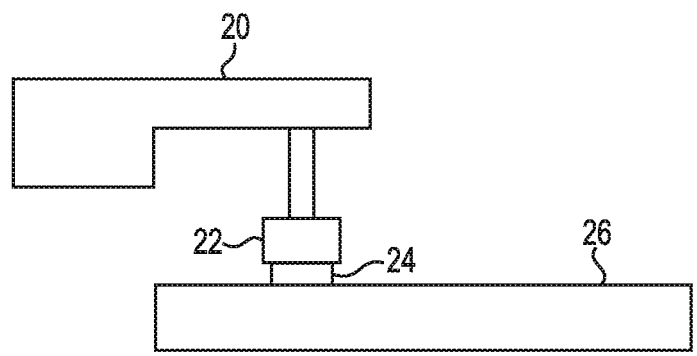
FIG. 2 is a schematic side view of an embodiment of an exemplary lapping process.

Referring now to FIG. 2, schematically depicted is a lapping system used for a kiss lapping step of a substrate, for example a slider rowbar. To an actuator or fixture 20 is operably connected carrier 22, to which is mounted slider rowbar 24 (or another substrate), by adhesive stack 10 (see FIG. 1) (not including release liners 2 and 12). One surface (contacted surface) of substrate (e.g., slider rowbar) 24 is illustrated as contacting a moving abrasive surface (the upper surface) of lapping plate 26 (also often referred to as a platen). Adhesive stack 10 includes adhesive 4, which is secured to substrate 24, and adhesive 8, which is secured to a surface of carrier 22. Adhesive stack 10 also includes base layer 6, which is located and adhesively held between adhesive 4 and adhesive 8.

Not shown in FIG. 2, present on the upper surface of lapping plate 26, are abrasive particles or an abrasive surface, to make up an abrasive material for contacting the contacted surface of substrate 24. The abrasive particles or surface may be present in a slurry or may be fixed to the surface of lapping plate 26, for example by adhesive or by electroplate. Also typically present at the surface of lapping plate 26 is a lubricant such as an oil, e.g., mineral oil. In use, lapping plate 26 is rotated relative to slider bar 24, which can remain stationary. One surface (the "contacted surface") of slider bar 24 is held in contact with the moving abrasive material surface of lapping plate 26 with a desired amount of pressure (e.g., less than 25 pounds per square inch, such as from about 5 to about 20 pounds per square inch). The abrading action caused by the moving abrasive material removes material from the contacted surface of slider bar 24, e.g., to result in a desired stripe height and to also provide a desired shape of the contacted surface.

Referring now to FIG. 3, an embodiment of an exemplary carrier 22 is illustrated, having secured thereto substrate (e.g., slider bar) 24 by use of adhesive stack 10 placed between a surface of carrier 22 and the backside surface of substrate 24. Carrier 22 includes a base 28, for mounting carrier 22 to fixture 20. Base 28 is a rigid base, typically made of material such as metal, glass, polymer, or ceramic. Base 28 may be a single-piece or a multiple-piece fixture, and may include any number of optional features such as pliable fingers or nodes for actuated lapping, actuation points along the length of carrier 22, and other elements designed to improve, affect, or control one or more the dimensions or the shape of the contacted surface of a substrate such as slider assemblies of slider bar 24 during the lapping process. Nonlimiting examples of carriers are described in U.S. Pat. No. 8,066,547 to Schuh et al.); U.S. Pat. No. 6,475,064 to Hao et al.), and U.S. Ser. No. 15/298,883 filed on Oct. 20, 2016 by Xiong et al., the entirety of each patent document being incorporated herein by reference. Base 28 may have incorporated therewith circuitry (e.g., flexible circuitry) for monitoring an amount of material removed from a substrate, e.g., at a stripe height of individual slider assemblies of a slider bar 24, or of groups of adjacent slider assemblies of slider bar 24.

More generally, according to certain lapping methods, a contacted surface of a slider bar or other substrate is lapped by use of a lapping machine, e.g., as illustrated, with motion (e.g., rotating motion) of the abrasive material and contact of the abrasive material with the contacted surface of the substrate while the substrate is held at the surface of the carrier. For lapping of a slider bar, the progress of the lapping step is monitored to achieve a predetermined stripe height for slider assemblies of the slider bar. As the abrasive material contacts the substrate, it advances from the leading end and middle portion of the slider assembly, which contain the slider elements of the slider assemblies, to the trailing end, which contains the one or more transducing heads and at which location the stripe height is measured. The stripe height of single slider assemblies on the slider bar may be monitored, and adjustments may be made to the process to remove more or less material from the trailing end of the slider assembly by application of a greater or lesser amount of pressure to one or more slider assemblies on the slider bar. When the desired stripe height of the slider assemblies on the slider bar is achieved, the lapping step can be stopped and the lapped slider assemblies can be removed from the carrier.

According to the present disclosure, including the use of an adhesive as adhesive 4 as shown in FIG. 3, having properties described herein, including Elastic Modulus and Tan Delta, the lapping step also achieves a desired shape of the slider element of the slider assemblies of the slider rowbar.

Types of microelectronic device substrates that can be processed in this manner include substrates that contain integrated circuits, optical devices, or transducer heads (magnetic read and read-write heads, among others. Many details of the present description are presented in terms of a lapping step for processing a microelectronic device substrate that is a "slider rowbar," meaning a bar of multiple sliders that are connected at their length-wise edges. While the present description is presented in large part as applying to lapping steps for processing sliders, the present disclosure, including the use of a pressure-sensitive adhesive as described herein, is not limited to a lapping process or lapping step that operates on a slider rowbar as the substrate. Instead, while slider rowbars are exemplary substrates, lapping steps as described herein can be used with any type of microelectronic device substrate that can be processed in a useful manner by a lapping step, including microelectronic device substrates that are different from slider rowbars, including devices and their precursors that are designed to function as optical devices, memory devices, integrated circuits, among others.

What is claimed is:

1. A method of forming an adhesive film, wherein the method comprises:
    forming an adhesive film comprising:
        a first release liner comprising a polymeric film;
        a second release liner comprising a polymeric film; and
        an adhesive structure comprising:
            a base layer comprising a polymeric film having a thickness in a range from 3 to 10 mils;
            a layer of a first adhesive composition positioned between the first release liner and the base layer, wherein the layer of first adhesive composition has a thickness in a range from 15 to 25 mils; and
            a layer of a second adhesive composition positioned between the base layer and the second release liner, wherein the second adhesive composition is different from the first adhesive composition, and wherein the layer of second adhesive composition has a thickness in a range from 3 to 10 mils;
            wherein forming the layer of the first adhesive composition comprises:
    providing the first adhesive composition comprising at least one pressure-sensitive adhesive polymer, wherein the at least one pressure-sensitive adhesive polymer comprises at least one block copolymer comprising at least one polyacrylate; and
    forming the layer of the first adhesive composition on the first release liner or the base layer, wherein the at least one pressure-sensitive adhesive polymer is fully polymerized and does not undergo any further chemical reaction during and/or after forming the layer of the first adhesive composition, wherein the layer of the first adhesive composition and the adhesive structure have an Elastic Modulus in a range from 100 to 500 kilopascals measured at 25 degrees Celsius, and a Tan Delta in a range from 0.05 to 0.2 measured at 25 degrees Celsius.

2. The method of claim 1, wherein the at least one polyacrylate is chosen from polymethylmethacrylate, polybutylacrylate, polyhydroxyethylmethacrylate, poly 1,3-butanediol dimethacrylate, polyethylacrylate, and combinations thereof.

3. The method of claim 1, wherein forming the layer of the first adhesive composition comprises:
    a) melting the first adhesive composition; and
    b) extruding the melted first adhesive composition onto the first release liner or the base layer to form the layer of the first adhesive composition.

4. The method of claim 1, wherein the first adhesive composition further comprises at least one plasticizer.

5. The method of claim 4, wherein the at least one plasticizer comprises at least one ester plasticizer.

6. The method of claim 4, wherein the at least one plasticizer is present in an amount from 5 to 40 percent by total weight of the first adhesive composition, and the at least one pressure-sensitive adhesive polymer is present in an amount from 60 to 95 percent by total weight of the first adhesive composition.

7. The method of claim 5, wherein the at least one plasticizer comprises at least one ester of phenol plasticizer.

8. The method of claim 5, wherein the at least one ester plasticizer is present in an amount of greater that 20 percent by total weight of the first adhesive composition.

9. The method of claim 7, wherein the at least one ester of phenol plasticizer comprises alkylsulfonic acid ester of phenol.

10. The method of claim 1, wherein the layer of the first adhesive composition has a Peel Force in a range from 50 to 1000 grams force.

11. The method of claim 1, wherein the at least one polyacrylate comprises a polymethylmethacrylate homopolymer block and a polybutylacrylate homopolymer block.

12. The method of claim 1, wherein the at least one pressure-sensitive adhesive polymer is present in an amount from 70 to 95 percent by total weight of the first adhesive composition.

13. The method of claim 1, wherein the first adhesive composition does not include a tin-containing catalyst.

14. The method of claim 1, wherein the first adhesive composition includes less than 100 parts per million of tin.

15. The method of claim 1, wherein the first adhesive composition does not include silicone.

16. A method of using the adhesive film formed by the method of claim 1, wherein the method comprises:
 removing the first release liner and the second release liner from the adhesive film;
 applying the layer of the second adhesive composition to a surface of a carrier, wherein the carrier is configured to be operably connected to a lapping system; and
 applying the layer of the first adhesive composition to a surface of a slider rowbar.

17. The method of claim 16, further comprising operatively connecting the carrier to the lapping system.

* * * * *